United States Patent [19]
LeParquier et al.

[11] Patent Number: 5,002,895
[45] Date of Patent: Mar. 26, 1991

[54] WIRE BONDING METHOD WITH A FRAME, FOR CONNECTING AN ELECTRONIC COMPONENT FOR TESTING AND MOUNTING

[75] Inventor: Guy LeParquier, Paris; Christian Val, St. Remy les Chevreuses, both of France

[73] Assignee: Thomson-CSF, Paris, France

[21] Appl. No.: 431,448

[22] Filed: Nov. 3, 1989

Related U.S. Application Data

[63] Continuation of Ser. No. 181,740, Apr. 14, 1988, abandoned.

[30] Foreign Application Priority Data

Apr. 17, 1987 [FR] France .............................. 87 05486

[51] Int. Cl.$^5$ ............................................. H01L 21/60
[52] U.S. Cl. ........................................ 437/8; 437/206; 437/228; 357/70
[58] Field of Search .................... 437/8, 228, 206; 29/762, 835; 357/70; 228/179; 156/64

[56] References Cited

U.S. PATENT DOCUMENTS

| | | | |
|---|---|---|---|
| 3,795,043 | 3/1974 | Forlani | 437/228 |
| 4,026,008 | 5/1977 | Drees et al. | 437/8 |
| 4,027,383 | 6/1977 | Herndon et al. | 437/8 |
| 4,102,039 | 7/1978 | Henrickson et al. | 264/251 |
| 4,189,825 | 2/1980 | Robillard et al. | 437/213 |
| 4,243,937 | 1/1981 | Multani et al. | 292/173 |
| 4,411,719 | 10/1983 | Lindberg | 437/8 |
| 4,792,532 | 12/1988 | Ohtani et al. | 437/8 |

FOREIGN PATENT DOCUMENTS 5546578 4/1980 Japan .................................. 437/8

Primary Examiner—Olik Chaudhuri
Assistant Examiner—David E. Graybill
Attorney, Agent, or Firm—Roland Plottel

[57] ABSTRACT

A device and method are disclosed for connecting an electronic component so that it can be tested and mounted. According to the method, pads on the component are first connected to pads on a surrounding frame, by means of conducting wires. The component is tested by probes of the testing instruments to the pads of the surrounding frame. When the tests are done, the component and its frame is placed on the substrate on which it has to be mounted. The pads of the component are connected to pads on the substrate by the wires used for connection to the pads of the surrounding frame. After connection, the wires are cut between the substrate pads and the frame pads, and then the frame is removed.

3 Claims, 2 Drawing Sheets

FIG_1
PRIOR ART
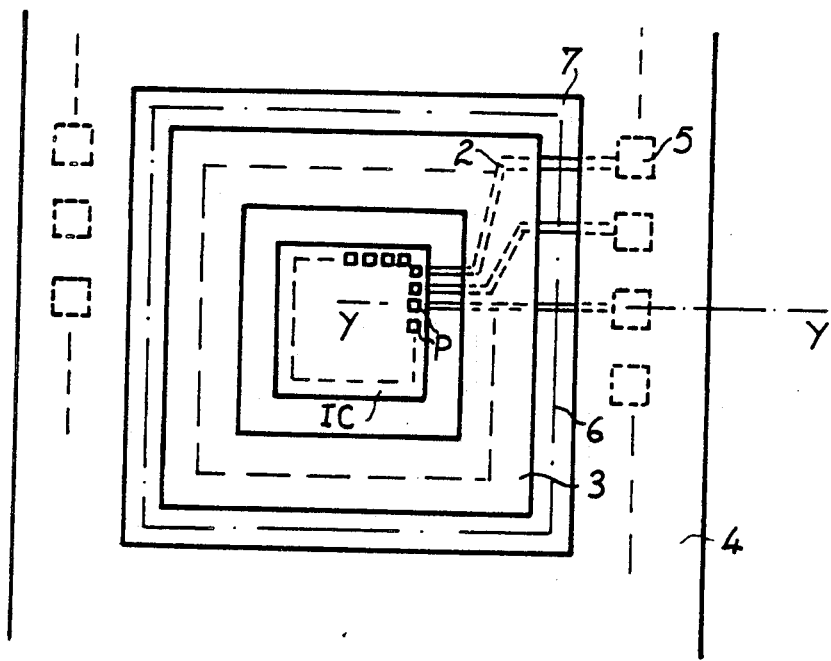
FIG_2
PRIOR ART
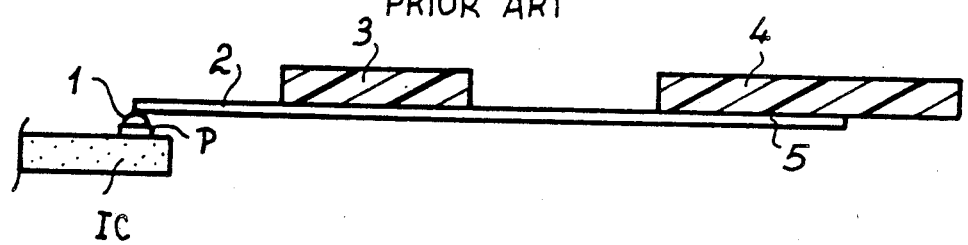
FIG_3 PRIOR ART
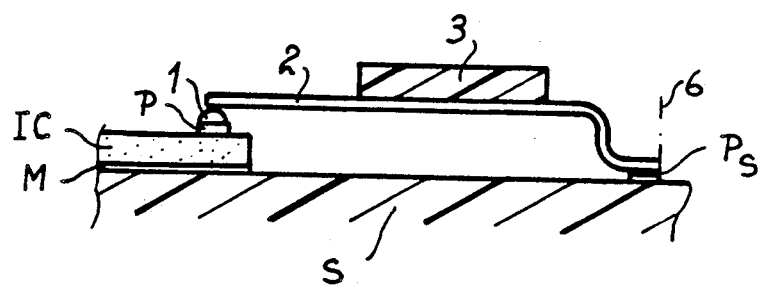

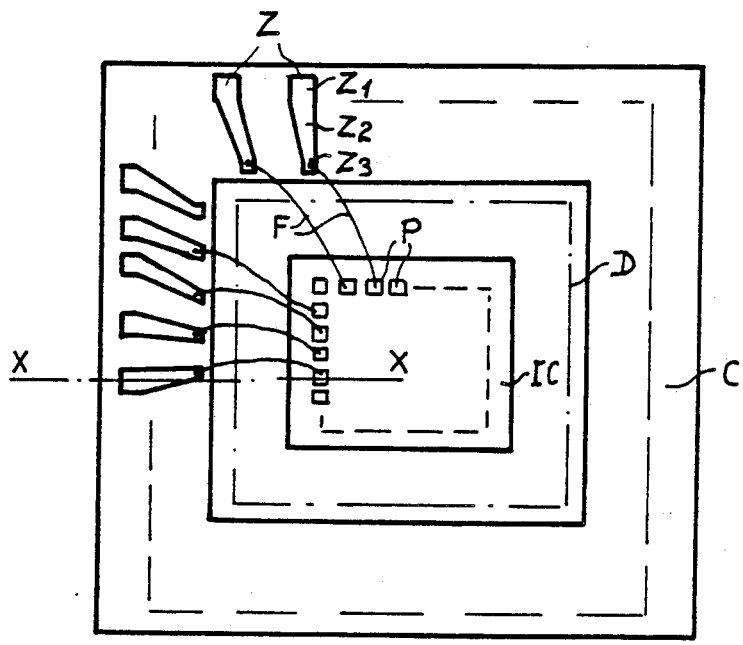
FIG_4
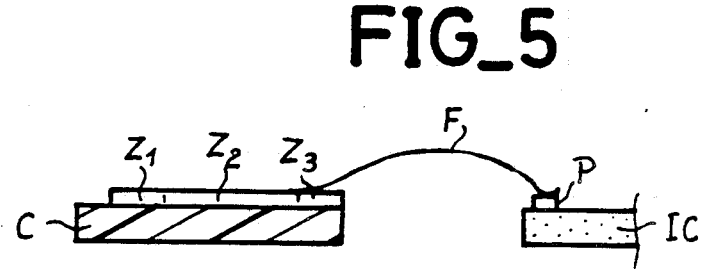
FIG_5
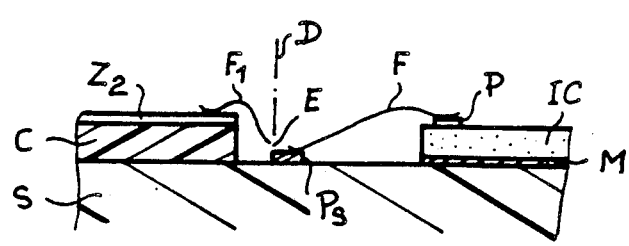
FIG_6

WIRE BONDING METHOD WITH A FRAME, FOR CONNECTING AN ELECTRONIC COMPONENT FOR TESTING AND MOUNTING

This application is a continuation of application Ser. No. 07/181,740, filed Apr. 14, 1988, abandoned.

BACKGROUND OF THE INVENTION

1. Field of the Invention

The present invention is a method to connect an electronic component in order to test it and mount it on a substrate (circuit or package) as well as a device to implement this method.

2. Description of the Prior Art

It is known that electronic components should be tested and debugged before being mounted if this mounting is to be done efficiently. This is especially important for complex integrated circuits. For simplicity's sake, only "testing" shall be referred to in the rest of this text, it being understood that this term also includes debugging. These components should be tested preferably throughout the temperature range of their use, under voltage and at the clock frequency of the integrated circuit.

To mount a component on a substrate (circuit or package), in the standard wiring method, each of the connection pads of the component is connected to a pad of the substrate by means of conducting wires. In this case, to test the component before it is mounted, conducting probes, connected to the testing instruments, are used. These conducting probes are placed in mechanical and electrical contact with the pads of the components. This method has inadequacies and flaws. These probes do not provide for entirely satisfactory tests, particularly because they introduce unwanted phenomena: in particular, they cannot be used for high frequency testing (at a few tens of MHz for example). Furthermore, they leave dents on the pads to which they are applied. These dents make the pads brittle and may cause them to be damaged. The result of this is that the component often has to be tested at least partly after it is mounted. This necessitates repairs which increase in number and, therefore, become lengthier and costlier in proportion to the complexity of the component.

Another method is that of the prior art technique known as the tape automatic bonding (TAB) technique, described in greater detail below. This technique consists mainly in placing the component on a tape, arranged so that the component can be tested before it is mounted. However, the TAB method has disadvantages. Mounting the component on the tape makes it necessary to have projections. These projections have to be made on the connecting pads of the component so that the conductors carried by the tape can be soldered. This is a fairly lengthy and costly operation. Furthermore, a portion of the tape is usually left around the component after the test, thus making the component more bulky.

SUMMARY OF THE INVENTION

An object of the present invention is a method by which a component can be entirely tested before it is mounted and which does not call for any special measures, such as bumps, in the component to be tested, a method that uses testing elements which are eliminated after the test, thus reducing the space occupied by the component.

More precisely, the method of the invention comprises the following steps:

The method of the invention basically is as follows. The component to be tested is first surrounded by a frame on which are provided conductive pads to which test probes may be applied and these pads are connected to respective pads of the component by connecting wires. After testing, the component and its frame are mounted on the substrate that is to support the component in its apparatus application. This substrate also includes pads bu which the component is to be interconnected into the apparatus for use. Then each of the connecting wires needed for interconnecting the component into this circuit is connected at an intermediate point along its length between the frame pad and the component pad to a respective one of the substrate pads, and is then cut to free the connection between the substrate pad and the frame pad so that the frame may now be separated from the component. The invention also includes the arrangement for effecting the described method.

BRIEF DESCRIPTION OF THE DRAWINGS

Other objects, special features and results of the invention will emerge from the following description, which is given as a non-restrictive example and illustrated by the appended drawings, of which:

FIG. 1 is a top view illustrating the prior art method known as TAB;

FIG. 2 is a sectional view, along the axis YY, of the above figure;

FIG. 3 is a sectional view of the mounting of the component, once it is tested, on a substrate for use;

FIG. 4 is a top view illustrating the method and connection means of the invention;

FIG. 5 is a sectional view, along the axis XX, of the preceding figure;

FIG. 6 is a sectional view of the mounting of the previously tested component on a substrate for use.

These various figures are not drawn to scale and the same references are repeated for the same elements.

DESCRIPTION OF A PREFERRED EMBODIMENT

FIG. 1 shows a top view of the structure used by the TAB method.

This structure consists of a continuous tape 4 made of an insulating material, with a series of central gaps 7. A component to be tested and connected is placed in each of these gaps 7. The figure shows only one gap 7 in which a component IC, such as an integrated circuit, is placed. This circuit IC is provided with connection pads, marked P, at its edge. The tape 4 has metallized zones or testing pads 5 on the edges of its lower surface, designed to take the probes of the instruments for testing the component IC. The device of FIG. 1 also has an immediate support frame 3 between the tape 4 and the component CI.

Finally, the tape 4 has, in the vicinity of its edges, positioning holes (not shown).

FIG. 2 shows the device of the preceding figure in a partial cross-section, along an axis YY. This section partly shows the component IC and the tape 4 as well as a portion of the intermediate frame 3.

This section shows the electrical connection between a pad P of the component IC and the testing pad 5 of the tape 4. This electrical connection is made with a conducting lead 2, or strip carried by the lower surface of the tape 4 from the pads 5 onwards, and held by the intermediate frame 3. The strip 2 is soldered to the pad P by means of a projection (or bump) 1. According to this method, the various strips 2 are all soldered together to the various pads P and a projection such as 1 then becomes necessary both to compensate for planarity unevennesses among the various pads P and to withstand the pressures needed for soldering (the resistance of the pads P, which are very thin, may not be sufficient).

However, the need for these projections constitutes a disadvantage of the method: for the components need to undergo additional metallurigical operations to make these projections, and this is a disadvantage in itself. Furthermore, these projections are relatively complicated to make (they generally require more than half a dozen different operations). A method of this type can therefore be applied only to components which have been provided with projections beforehand, and this increases their cost.

When the component IC is thus connected to the testing pads 5, the testing probes are also connected to these same pads 5 and the testing operations are done. When these testing operations are completed, the tape 4 and the component IC that it carries are placed on the substrate on which the component has to be mounted. This typically is a printed circuit substrate or a package base as shown in a partial section in FIG. 3.

The component IC is fixed to the substrate S by a conducting layer M for example. The substrate S has connecting pads $P_s$ to which the pads P have to be connected. For this purpose, this strips 2, which were used for the test, are soldered to the component IC. All the strips 2 are cut along a cutting axis 6, located between the intermediate frame 3 and the rest of the tape 4. The strips 2, held in position by the intermediate frame 3, are brought into contact with the pads $P_s$ of the substrate S and are then soldered to them.

Another disadvantage of the TAB method can be seen here: the intermediate frame 3 is kept permanently around the component IC, thus increasing its bulk.

FIG. 4 shows a top view of the structure used in the method according to the invention.

FIG. 4 shows the component IC provided with its connection pads P. This component IC is placed inside a frame C made of an insulating material. The frame C has metallizations Z, known as test zones. More precisely, each of these metallization zones is preferably made up of: firstly, a pad $Z_1$, these pads $Z_1$ being placed near the outer edge of the frame C and being designed to receive the probes of the instruments for testing the component IC; secondly, a conducting strip $Z_2$ placed on the frame C and connecting the pad $Z_1$ at the inner edge of the frame C where a second pad $Z_3$ is placed. The pads P of the component IC are connected to the pads $Z_3$ by conducting wires F.

It should be noted that the pads $Z_3$ may or may not face the pads P.

The frames such as C may be on a continuous tape of a succession of aligned frames, on a tape limited to a few frames, or again, on a single frame tape, the said frame C being set in a support of the type used for slides.

The frame C also usually has means, for example holes (not shown), at its edge for positioning it with respect to a component. FIG. 5 shows the device of the previous figure in a partial cross-section along an axis XX.

This cross-section also gives a partial view of the component IC and a portion of the frame C. This section shows the electrical connection between a pad P of the component IC and the frame pad $Z_3$ by means of the wire F, the outer pad $Z_3$ being extended by the strip $Z_2$ to the inner pad $Z_1$.

When the component IC is connected to the pad $Z_1$, the testing probes are also conductively connected to the pad $Z_1$, and the testing operations may be performed.

When these testing operations are completed, the component IC and its frame C are placed on a substrate on which the component has to be mounted for its interconnection into a useful circuit, as shown in a partial section in FIG. 6.

The component IC is fixed, for example, to the substrate S by a soldered or bonded conducting layer M. The substrate S has connection pads $P_s$ to which the component pads P have to be connected. For this purpose, each of the wires F is bent so that it comes into contact with the substrate pad $P_s$. It is welded to this pad and the rest of the wire F (the part marked $F_1$) is cut along a cutting axis D, located after the pad $P_s$, so that the frame C can be released and thus removed. The cut portion is shown by a space E in FIG. 6.

It is thus seen that the invention enables the complete testing of the component before it is mounted, without any special treatment (for example the making of projection) of the component, and then the mounting of the component on a substrate for use without any increase in bulk since the frame used for the test is then removed.

What is claimed is:

1. A method comprising the steps of surrounding for testing an electronic component that includes component pads with a frame that includes test zones adapted to be contacted with testing probes and wires connecting the test zones to the component pads, after testing, supporting the component and the frame on a substrate which is adapted for supporting the component in apparatus for utilization and which includes substrate pads for interconnection of said component in said apparatus, connecting the connecting wires at intermediate points of their lengths to respective ones of the substrate pads, and cutting the connecting wires at points intermediate between the substrate pads and the test zones for freeing the frame from the connection to the component, and removing the frame leaving the component mounted on the substrate with the component pads connected to the substrate pads.

2. The method of claim 1 in which the connecting wires are connected to the substrate pads by bending the connecting wires and then bonding them to the substrate pads.

3. The method of claim 1 in which electronic component and its surrounding frame are positioned on a tape during the testing.

* * * * *